United States Patent
Lim

(10) Patent No.: US 9,660,645 B2
(45) Date of Patent: May 23, 2017

(54) DOOR HANDLE MODULE FOR VEHICLE AND APPARATUS FOR LOCKING AND UNLOCKING VEHICLE DOOR INCLUDING THE MODULE

(71) Applicant: Hyundai Mobis Co., Ltd., Seoul (KR)

(72) Inventor: Jong Chul Lim, Anyang-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 14/920,180

(22) Filed: Oct. 22, 2015

(65) Prior Publication Data
US 2016/0118981 A1    Apr. 28, 2016

(30) Foreign Application Priority Data

Oct. 23, 2014    (KR) .................. 10-2014-0144213

(51) Int. Cl.
    *G01R 27/26*       (2006.01)
    *H03K 17/955*      (2006.01)
    *H03K 17/96*       (2006.01)
    *B60R 25/24*       (2013.01)

(52) U.S. Cl.
CPC ......... *H03K 17/955* (2013.01); *H03K 17/962* (2013.01); *B60R 25/246* (2013.01); *H03K 2217/960715* (2013.01)

(58) Field of Classification Search
CPC .. G01R 27/26; G01R 27/2605; H03K 17/945; H03K 17/955; H03K 17/962; H03K 2217/945; H03K 2217/96; H03K 2217/9607; H03K 2217/960715
USPC .......................................................... 327/517
See application file for complete search history.

(56) References Cited

U.S. PATENT DOCUMENTS

2010/0327953 A1* 12/2010 Lee ..................... H03K 17/962
                                                       327/517
2015/0160277 A1* 6/2015 Seo .......................... G01D 5/24
                                                       324/686

FOREIGN PATENT DOCUMENTS

KR         10-0767477 B1     10/2007
KR         10-1500400 B1     3/2015

\* cited by examiner

*Primary Examiner* — William Hernandez
(74) *Attorney, Agent, or Firm* — NSIP Law

(57) ABSTRACT

Disclosed is a door handle module for a vehicle. The module includes a pulse transformer configured to transform a first discharge pulse (⑦) of a first voltage level (V1), which is discharged from a touch sensor, to a second discharge pulse ⑧ with a rising section which increases the first discharge pulse (⑦) to a second voltage level (V2) which is higher than the first voltage level; an effective pulse generator configured to generate an effective pulse (⑩) using a voltage detected in the rising section of the second discharge pulse (⑧); and a charge amplifier configured to amplify the effective pulse (⑩) to an analog voltage in an analog form and output the amplified analog voltage as a signal for controlling locking and unlocking of a vehicle door.

20 Claims, 5 Drawing Sheets

DOOR HANDLE MODULE FOR VEHICLE AND APPARATUS FOR LOCKING AND UNLOCKING VEHICLE DOOR INCLUDING THE MODULE

CROSS-REFERENCE TO RELATED APPLICATION

This application claims priority to and the benefit of Korean Patent Application No. 10-2014-0144213, filed on Oct. 23, 2014, the disclosure of which is incorporated herein by reference in its entirety.

BACKGROUND

1. Field of the Invention

The present invention relates to a door handle module for a vehicle and an apparatus for locking and unlocking a vehicle door including the module, and more particularly, to a touch sensor-based door handle module for a vehicle and an apparatus for locking and unlocking a vehicle door including the module.

2. Discussion of Related Art

Generally, as a method in which locking and unlocking of a vehicle door are controlled, there are a method using a toggle switch and a method using a touch sensor. Among them, in a method using a touch sensor, locking and unlocking of a vehicle door may be controlled with only an action of approach (or contact) of a human body to a door handle.

FIG. 1 is a block diagram illustrating a conventional apparatus for controlling locking and unlocking of a vehicle door using a touch sensor.

Referring to FIG. 1, the conventional apparatus for controlling locking and unlocking of the vehicle includes a sensor 400 and a sensor controller 500 that controls the sensor 400.

The sensor 400 is embedded in a vehicle door handle and configured to detect a part of a human body that approaches the door handle, and may be a touch sensor, such as a capacitive sensor. That is, the capacitive sensor detects a capacitance changed when a part of a human body approaches.

The sensor controller 500 includes a charge condenser 501, a discharge condenser 502, a multiplexer (MUX) 503, a comparator 504, a controller 505, and a diode 506.

The charge condenser 501 discharges a capacitance which has been charged through a path including the sensor 400 and the discharge condenser 502.

The MUX 503 controls discharge of the charge condenser 501 in response to a discharge pulse signal from the controller 505.

The discharge condenser 502 discharges the charge condenser 501 through the MUX 503 in a no-load state.

The comparator 504 compares a reference voltage with a voltage that varies due to the discharge of the charge condenser 501 and outputs an effective pulse to the controller 505.

The controller 505 outputs the discharge pulse signal corresponding to the effective pulse input from the comparator 504 to the MUX 503. In addition, the controller 505 outputs a control signal to a door control apparatus.

In the conventional apparatus for locking and unlocking a vehicle door, when a part of a human body approaches the door handle, the sensor 400 detects a capacitance increased due to the approach of the part of the human body, the charge condenser 501 discharges through the MUX 503, the discharge condenser 502 and the sensor 400, and at this time, the comparator 504 compares the reference voltage with a voltage of the charge condenser 501 which is changed due to the discharge and outputs a comparison result to the controller 505.

The controller 505 calculates the number of effective pulses based on the comparison result input from the comparator 504. That is, the controller 505 compares the number of effective pulses, which is measured while the charge condenser 501 is being discharged, with the average number of pulses in a no-load state (or in a state in which the vehicle door is closed), and when a difference between the average number of pulses and the number of effective pulses occurs to be greater than or equal to the minimum number of effective pulses, determines that the change in capacitance is caused by the approach of the human body.

For example, when the average number of pulses in a no-load state is 500 and the number of effective pulses is changed to 450 due to an approach of a human body, the controller 505 computes 50 as a difference between the average number of effective pulses in the no-load state and the number of effective pulses due to the approach of the human body, and when the minimum number of effective pulses is less than 50, determines that the change in capacitance is due to the approach of the human body. If the difference is 2 to 3, it is a tolerance due to environmental factors, and is thus considered negligible.

Then, when the difference between the average number of effective pulses in a no-load state and the number of effective pulses due to an approach of a human body is determined to be greater than or equal to the minimum number of effective pulses that has been set beforehand, the controller 505 generates a door unlocked signal for changing a state of the vehicle door to a unlocked state and sends the generated unlocked signal to the door control apparatus. Then, in response to the door unlocked signal, the door control apparatus controls the vehicle door to be changed from a locked state to an unlocked state.

In the conventional apparatus for controlling locking and unlocking of the vehicle door, the controller 505 receives, as data from the comparator 504, the effective pulses generated while the sensor 400 is discharging electric charges due to an approach of a human body. At this time, the controller 505 recognizes data voltages Va, Vb, Vc, and Vd of the same voltage level that is generated in a falling section of each effective pulse, as shown in FIG. 2, and calculates the number of recognized data voltages as the number of effective pulses.

In this case, because the data voltages Va, Vb, Vc, and Vd detected in a falling section of the respective effective pulses drastically drop in a low voltage range of less than 1 V, the sensor 400 sensitively detects even a small change in capacitance, thereby causing a malfunction thereof. In particular, malfunctions frequently occur in an operating environment where a capacitance changes in a no-load state, for example, during rain.

In addition, although FIG. 2 illustrates four data voltages detected in a falling section of four effective pulses, in practice, numerous effective pulses need to be measured for comparison with the average number of effective pulses in a no-load state, and data voltages also need to be detected in each falling section of said measured effective pulses, and thus processing speed is degraded as the number of effective pulses is increased.

SUMMARY OF THE INVENTION

The present invention is directed to a touch sensor-based door handle module for a vehicle which is robust to changes in an operating environment and is capable of quickly determining whether or not a human body is approaching.

According to an aspect of the present invention, there is provided a door handle module for a vehicle including: a pulse transformer configured to transform a first discharge pulse (⑦) of a first voltage level (V1), which is discharged from a touch sensor, to a second discharge pulse (⑧) with a rising section in which the first discharge pulse (⑦) increases to a second voltage level (V2) which is higher than the first voltage level; an effective pulse generator configured to generate an effective pulse (⑩) using a voltage detected in the rising section of the second discharge pulse (⑧); and a charge amplifier configured to amplify the effective pulse (⑩) to an analog voltage in an analog form and output the amplified analog voltage as a signal for controlling locking and unlocking of a vehicle door.

According to another aspect of the present invention, there is provided an apparatus for locking and unlocking a vehicle door, the apparatus including: a touch sensor embedded in a handle of the vehicle door and configured to discharge a charged capacitance according to an approach of a human body; a door handle module configured to transform a first discharge pulse of a first voltage level (V1) that is produced according to discharge of the touch sensor to a second discharge pulse (⑧) with a rising section in which the first discharge pulse increases to a second voltage level (V2) which is higher than the first voltage level, and to generate an effective pulse (⑩) using a voltage detected in the rising section of the second discharge pulse (⑧) transformed from the first discharge pulse (⑦); and a controller configured to count the number of effective pulses (⑩) and determine, based on the counted number, whether or not there is an approach of a human body to the touch sensor.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

According to the present invention, a pulse (or a discharge pulse) that is generated according to discharging of a touch sensor caused by a approach (contact) of a human body is transformed using a delay circuit; a data voltage for determining whether or not there is an approach of a human body is sampled during a rising section of the transformed pulse; and it is determined whether or not there is the approach of a human body based on the sampled data voltage (or effective pulse).

Conventionally, whether or not there is an approach of a human body is determined based on a data voltage of less than 1 V that drastically drops in a falling section of the effective pulse, whereas the present invention determines whether or not a human body is approaching based on a data voltage of greater than 1 V that is sampled during the rising section of an effective pulse, and thus it is possible to prevent malfunctions due to sampling errors.

In addition, according to the present invention, the data voltage is sampled during a relatively higher voltage range (or a rising section of the effective pulse) than the related art, and hence accurate sampling is possible. Thus, it can be determined whether or not a human body is approaching a sensor sampling number fewer effective pulses than the related art (e.g., four).

Thus, in similar to the related art, a time delay, which was caused when many effective pulses are sampled, is minimized, so that a response time of a touch sensor due to the approach of the human body can be increased.

Hereinafter, exemplary embodiments of the present invention will be described in detail with the accompanying drawings.

Figure 1:
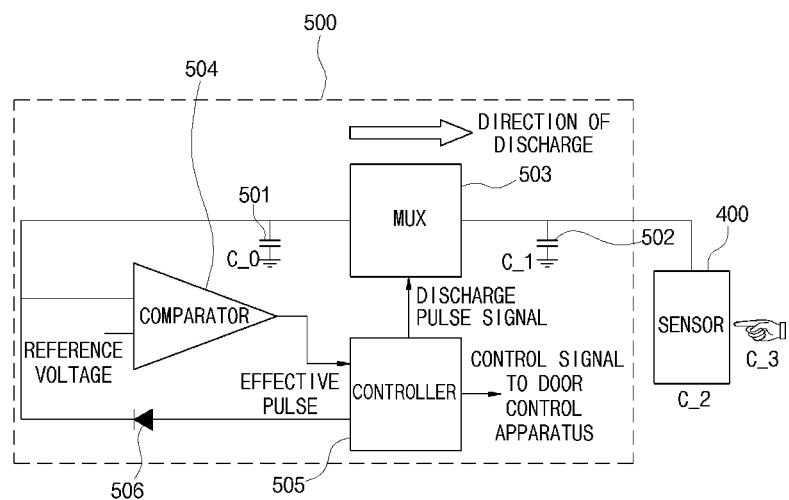
FIG. 1 is a block diagram illustrating a conventional apparatus for controlling locking and unlocking of a vehicle door using a touch sensor.
Figure 2:
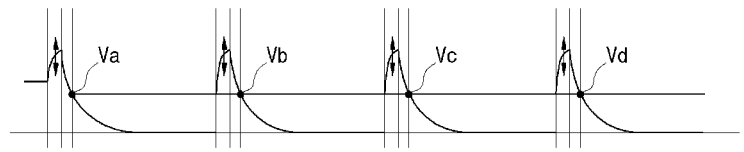
FIG. 2 is a waveform diagram of an effective pulse that is used as a reference for determining an approach of a human body in the related art.
Figure 3:
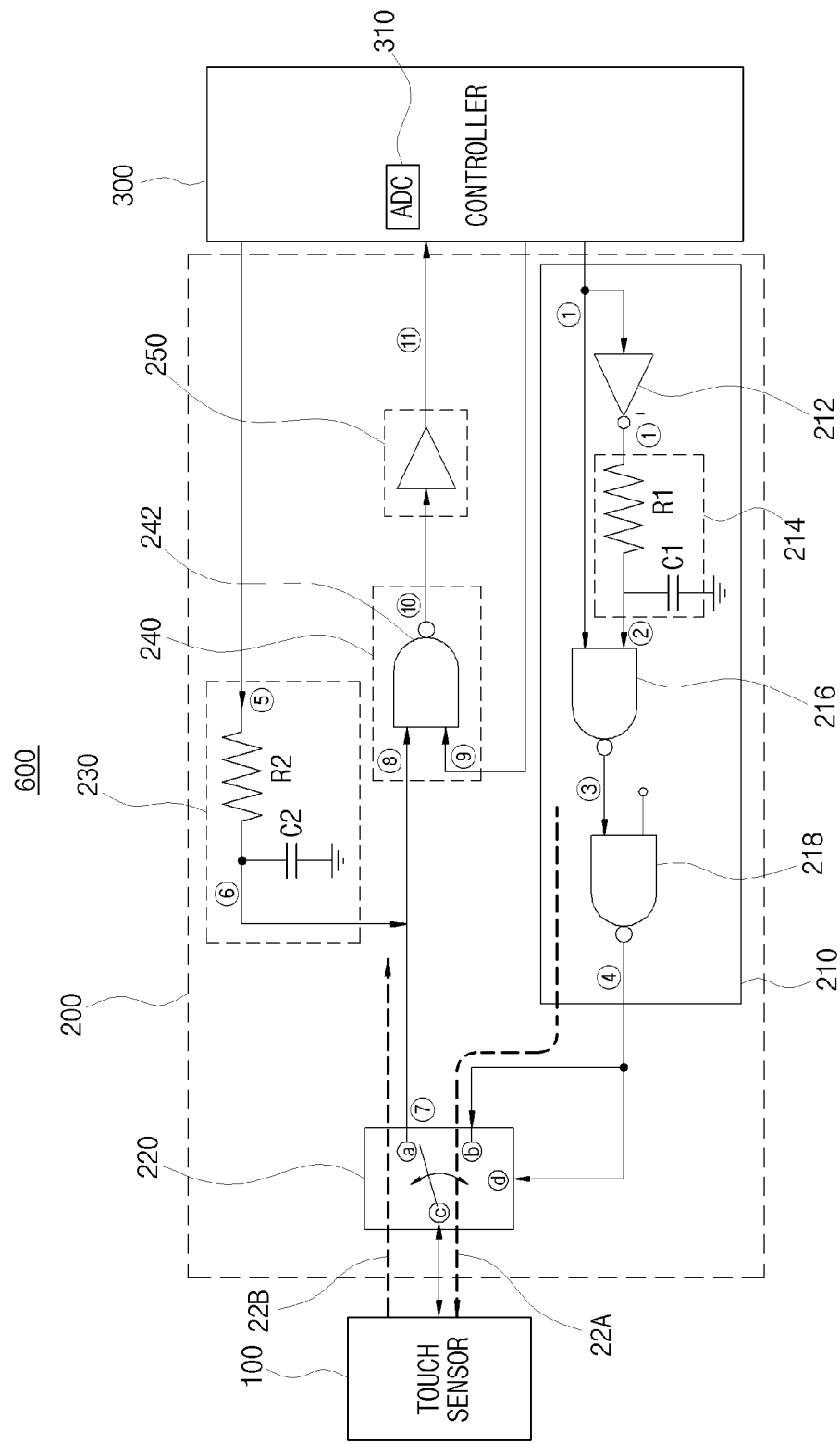
FIG. 3 is a block diagram illustrating an apparatus for locking and unlocking a vehicle door according to an exemplary embodiment of the present invention.

FIG. 3 is a block diagram illustrating an apparatus for locking and unlocking a vehicle door according to an exemplary embodiment of the present invention.

Referring to FIG. 3, the apparatus 600 for locking and unlocking a vehicle door includes a touch sensor 100, a door handle module 200, and a controller 300.

The touch sensor 100 may be a sensor, which is embedded in a vehicle door handle and performs an operation for discharging electric charges due to an approach of a human body. The touch sensor 100 may be a capacitive sensor that changes in capacitance when a human body is approaching. However, the touch sensor 100 is not limited to the capacitive sensor and may be any type of sensor as long as it is able to determine the approach of a human body.

The door handle module 200 generates an effective pulse due to discharge of the touch sensor 100. In addition, the door handle module 200 transforms the generated effective pulse into a pulse form suggested in the present invention. Moreover, the door handle module 200 samples a data voltage for determining whether or not a human body is approaching, during a rising section of the transformed effective pulse. This will be described in detail below.

The controller 300 determines whether or not a human body is approaching the touch sensor 100 based on the data voltage sampled by the door handle module 200. In the case in which the apparatus 600 is applied to a vehicle smart system, the controller 300 controls locking or unlocking of the vehicle door through a wireless authentication between the controller 300 and a smart key once the approach of a human body is conformed based on the sampled data voltage.

Door Handle Module 200

As described above, during the rising section of the transformed effective pulse, the door handle module 200 samples the data voltage for determining whether or not a human body is approaching.

To this end, the door handle module 200, as described in FIG. 3, includes an impulse generator 210, a switch 220, a pulse transformer 230, an effective pulse generator 240, and a charge amplifier 250.

The impulse generator 210 generates an impulse (④) to control a switching operation of the switch 220. The impulse generator 210 receives an input pulse (①) with a first cycle from the controller 300 and generates the impulse (④) with a cycle that is shorter than the first cycle.

Specifically, the impulse generator 210 includes an inverter 212, an RC circuit 214 including a resistor R1 and a capacitor C1 connected in parallel with each other, a first NAND gate 216, and a second NAND gate 218.

The inverter 212 receives the input pulse (①) with the first cycle from the controller 300 and inverts a waveform of the input pulse (①) to output an inverted pulse (①′).

The RC circuit 214 generates an inverted pulse (②) by delaying the inverted pulse (①′) by a specific period of time according to an RC time constant, which is decided by a resistance value of the resistor R1 and a capacitance value of the capacitor C1.

The first NAND gate 216 performs a NAND operation on the input pulse (①) input from the controller 300 and the inverted pulse (②) input from the RC circuit 214.

The second NAND gate 218 performs a NAND operation on the operation result from the first NADN gate 216 and a high level logic value (H) to generate an impulse (④) with the second cycle that is shorter than the first cycle of the input pulse (①).

The switch 220 performs a switching operation that forms a charge path 22A or a discharge path 22B according to the impulse (④) input from the impulse generator 210. The switch 220 may be a Single-Pole Double-Throw (SPDT) switch, but the type thereof is not limited as long as it has a configuration that is capable of forming the charge path 22A or a discharge path 22B.

The switch 220 includes a first terminal (ⓐ), a second terminal (ⓑ), a third terminal (ⓒ), and a control terminal (ⓓ), and according to the impulse (④) input through the control terminal (ⓓ), the switch 220 forms the charge path 22A that connects the second terminal (ⓑ) and the third terminal (ⓒ) or the discharge path 22B that connects the first terminal (ⓐ) and the third terminal (ⓒ).

When the discharge path 22B is formed by the switch 220, the pulse transformer 230 transforms a first discharge pulse (⑦) of a first voltage level to a second discharge pulse (⑧) which has a rising section in which a voltage level thereof increases to a second voltage level that is higher than the first voltage level, wherein the first discharge pulse (⑦) is output through the first terminal (ⓐ). To this end, the pulse transformer 230 includes a resistor R2 and a capacitor C2 which are connected in parallel with each other. The pulse transformer 230 generates a delayed input pulse (⑥) by delaying an input pulse (⑤), which is input from the controller 300 through one end of the resistor R2, by a specific period of time according to an RC time constant that is decided by a resistance value of the resistor R2 and a capacitance value of the capacitor C2. The generated delayed input pulse (⑥) of the second voltage level is added up to the first discharge pulse (⑦) of the first voltage level, so that the first discharge pulse (⑦) is transformed to the second discharge pulse (⑧). In the present exemplary embodiment, the pulse transformer 230 implemented as an RC circuit is provided in order to generate the delayed input pulse (⑥), but aspects of the present disclosure are not limited thereto, such that the pulse transformer 230 can be implemented as any types of circuit or software that is capable of generating a signal of a similar form as the delayed input pulse (⑥).

The effective pulse generator 240 generates an effective pulse (⑩) that is represented on a time axis using a voltage detected in a rising section of the second discharge pulse (⑧).

Specifically, the effective pulse generator 240 includes a third NAND gate 242. The third NAND gate 242 is able to generate the effective pulse (⑩) by performing a NAND operation on a voltage level in the rising section of the second discharge pulse (⑧) that is input through one input terminal of the third NADN gate 242 and an input pulse (⑨) from the controller 300 through the other input end. Here, the input pulse (⑨) is a pulse that is synchronized with the rising section of the second discharge pulse (⑧) and is different from the input pulse ① that is input from the controller 300 to the impulse generator 210.

The charge amplifier 250 amplifies the effective pulse (⑩) that is represented on the time axis into an analog voltage (⑪) in an analog form, and then it outputs the amplified analog voltage (⑪) to an analog-digital converter (ADC) 310 of the controller 300.

The ADC 310 of the controller 300 converts the analog voltage ⑪ into a digital voltage, and the controller 300 calculates the number of effective pulses using the digital voltage and then determines whether a human body approaches the touch sensor 100 based on the calculated number.

Hereinafter, operations of each element of the door handle module 200 will be described in detail with reference to waveform diagrams of FIGS. 4 to 7.

Figure 4:
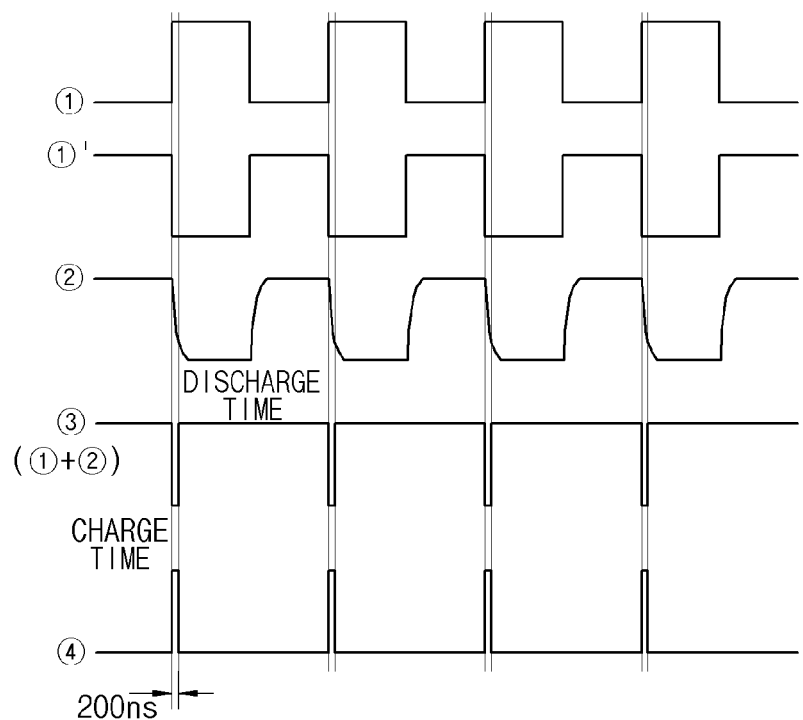
FIG. 4 is a waveform diagram for explaining operations of an impulse generator shown in FIG. 3.

FIG. 4 is a waveform diagram for explaining operations of the impulse generator shown in FIG. 3. FIG. 3 will also be referred to in order to facilitate the understanding of the description.

In the exemplary embodiment, the impulse generator 210 is assumed to generate an impulse with a high-level period of 200 ns.

To generate the impulse with a high-level period of 200 ns, the impulse generator 210 receives the input pulse (①) with a first cycle of 200 µs from the controller 300.

The input pulse (①) is inverted by the inverter 212, and the resulting pulse (①′) is transformed into the inverted pulse (②) that is delayed by 200 ns in the RC circuit 214.

Thereafter, the first NAND gate 216 performs a NAND operation on the input pulse (①) and the inverted pulse (②), so that a pulse ③ that maintains a low level during 200 ns is generated. The 200 ns period during which the pulse (③) is maintained in a low level is a charge time of the touch sensor 100, and a period during which the pulse (③) is maintained in a high level is a discharge time of the touch sensor 100.

The second NAND gate 218 performs a NAND operation on the pulse (③) and a high level logic signal so that the pulse (③) is transformed into the impulse signal (④) with a high-level period of 200 ns.

Figure 5:
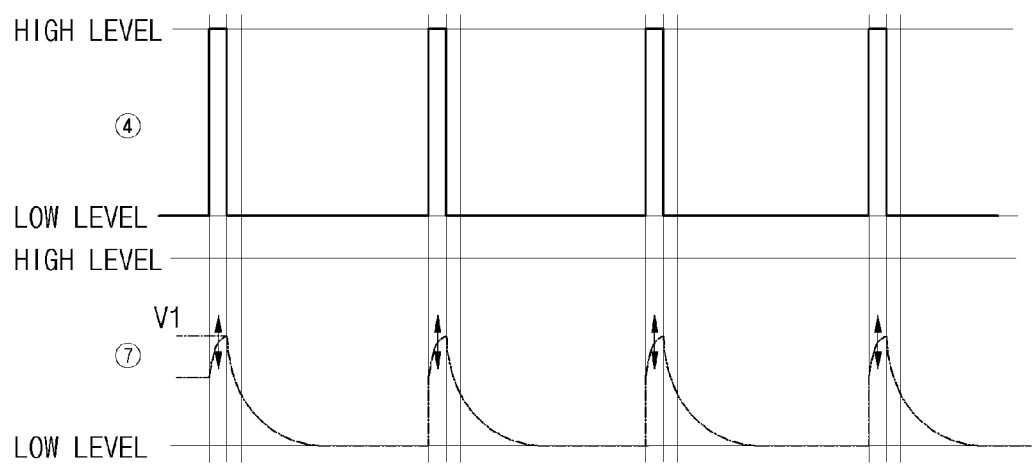
FIG. 5 is a waveform diagram for explaining operations of a switch shown in FIG. 3.

FIG. 5 is a waveform diagram for explaining operations of the switch shown in FIG. 3.

Referring to FIG. 5, the impulse signal (④) of a high level from the impulse generator 210 is input to the control terminal (ⓓ) of the switch 220, and the switch 220 forms the discharge path 22B that connects the first terminal (ⓐ) and the third terminal (ⓒ) in response to the high-level impulse signal (④).

The discharge path 22B is periodically formed within the 200 ns period. Therefore, the first discharge pulse (①), which is generated while the electric charges charged in the touch sensor 100 are being discharged, has a falling section in which the first discharge pulse (①) drastically decreases from the first voltage level (V1) (e.g., less than 1 V) within the 200 ns period, as shown in FIG. 5.

Figure 6:
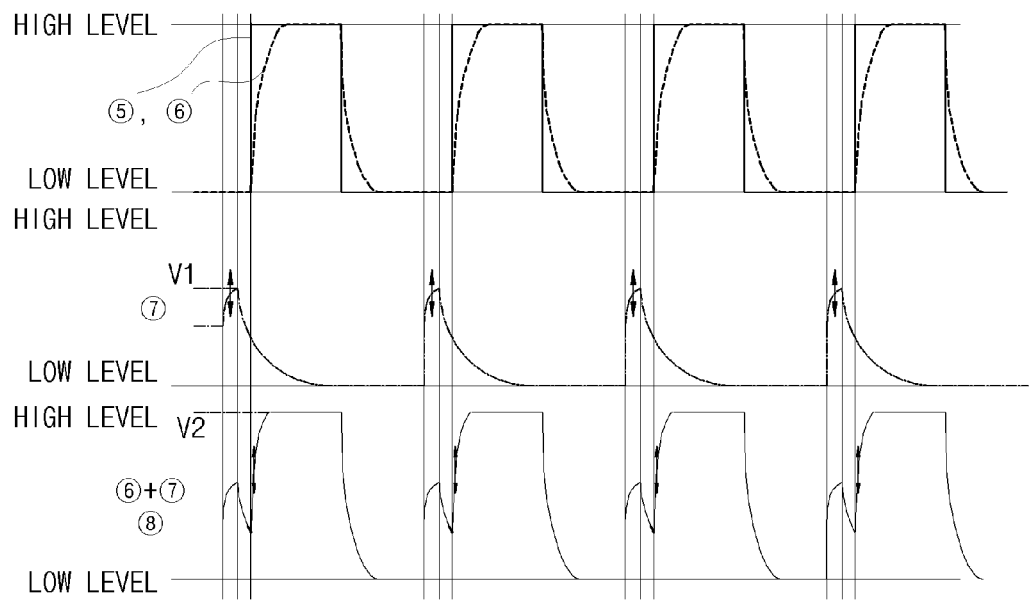
FIG. 6 is a waveform diagram of the second discharge pulse ⑧ that is generated by a pulse transformer of FIG. 3.

FIG. 6 is a waveform diagram of the second discharge pulse (⑧) is transformed from the first discharge pulse by the pulse transformer of FIG. 3.

Referring to FIG. 6, the first discharge pulse (⑦) from the first terminal (ⓐ) of the switch 220 is output to the effective pulse generator 240 over the discharge path 22B. At this time, the first discharge pulse (⑦) of the first voltage level (V1) is added up to the delayed input pulse (⑥) from the pulse transformer 230 that is applied to the discharge path 22B, thereby being transformed to the second discharge pulse (⑧).

Thus, the second discharge pulse (⑧) includes the first discharge pulse (⑦) of the first voltage level and the delayed input pulse (⑥) of the second voltage level that is continuous to the first discharge pulse (⑦) on the time axis.

Figure 7:
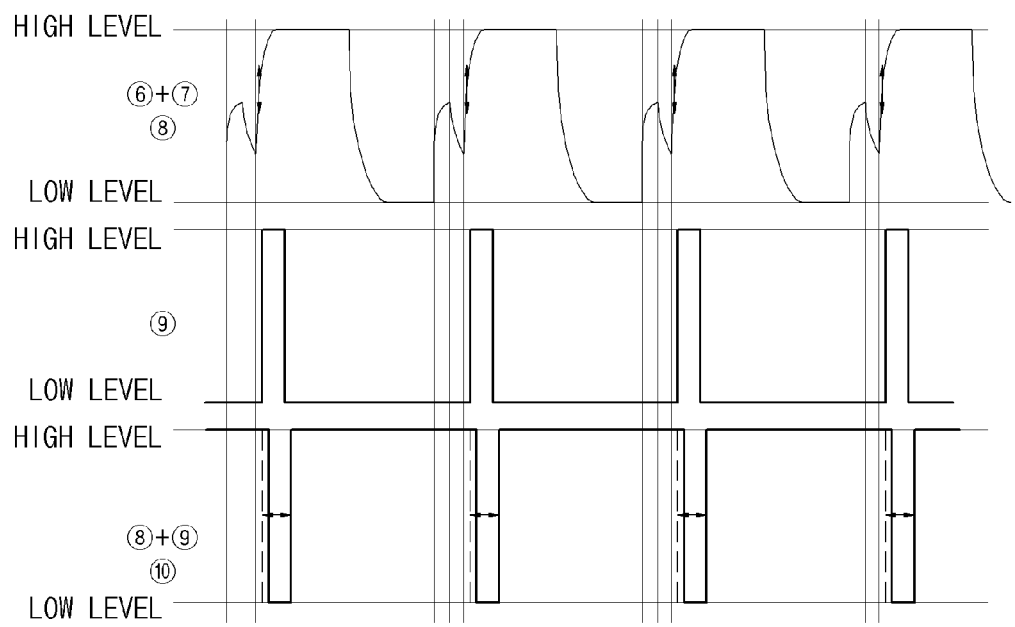
FIG. 7 is a waveform diagram for explaining operations of an effective pulse generator shown in FIG. 3.

FIG. 7 is a waveform diagram for explaining operations of the effective pulse generator shown in FIG. 3.

Referring to FIG. 7, the effective pulse generator 240, which is implemented as the third NAND gate 242, generates the effective pulse (⑩), which is represented on the time axis, using a rising section of the second discharge pulse (⑧).

Specifically, a NAND operation is performed on the second discharge pulse (⑧) and the input pulse (⑨) of a high level, which is synchronized with the rising section of the second discharge pulse (⑧), that is, the rising section of the delayed input pulse (⑥) included in the second discharge pulse (⑧), so that the effective pulse (⑩) of a low level that can be represented on the time axis is generated.

The effective pulse (⑩) is amplified to the analog voltage (⑪) by the charge amplifier 250 and delivered to the ADC 310 in the controller 300.

From the above description, the present invention shows mainly two differences as compared to the related art.

First, a method for generating the effective pulse (⑩) is different. Conventionally, a voltage (a low voltage less than 1 V) in a falling section of each first discharge pulse (⑦) is detected as shown in FIG. 8, and thus a number of voltages need to be detected to generate an accurate effective pulse (⑩).

On the contrary, in the present invention, a high voltage (1 V-1.5 V) appearing in a rising section of the second discharge pulse (⑧), which is transformed from the first discharge pulse (⑦), that is, a rising section of each pulse (⑥) which is temporally continuous to the first discharge pulse (⑦), is detected and hence, it is possible to generate an accurate effective pulse (⑩) by detecting less number of voltages (e.g., four) than in the related art.

Figure 8:
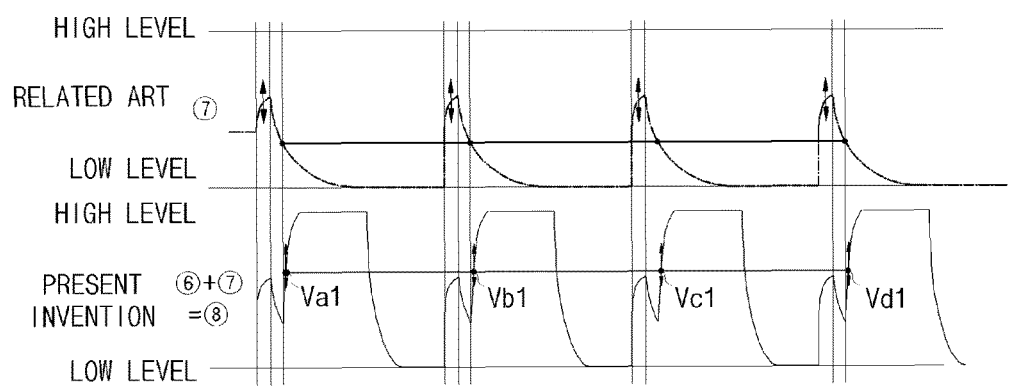
FIG. 8 is a waveform diagram for explaining differences between the present invention and the related art.

Meanwhile, in an exemplary embodiment of the present invention, an example in which four voltages Va1, Vb1, Vc1, and Vd1 having the same voltage level in rising sections of the second discharge pulse (⑧) (a rising section of each pulse (⑥) temporally continuous to the first discharge pulse (⑦) as shown in FIG. 8 are detected is described, but four voltages Va1, Vb1, Vc1, and Vd1 having different voltage levels (Va1<Vb1<Vc1<Vd1) may be detected, unlike the example of FIG. 8.

Figure 9:
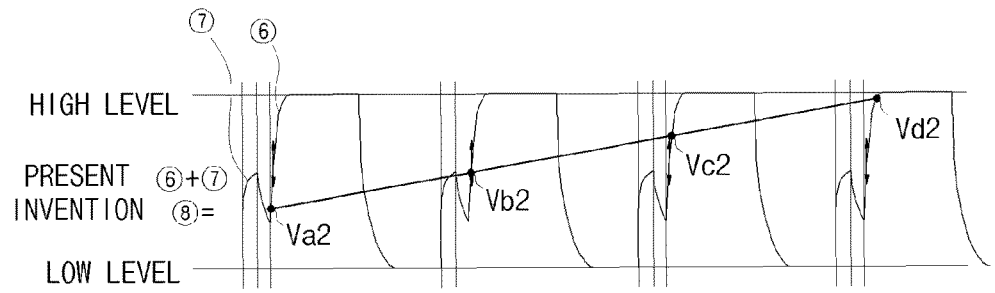
FIG. 9 is a waveform diagram showing examples of voltages detected in a second discharge pulse according to another exemplary embodiment of the present invention.

For example, as shown in FIG. 9, it is possible to detect four voltages Va2, Vb2, Vc2, and Vd2 gradually increasing in rising sections of the four delayed input pulses (⑥) temporally continuous to respective four first discharge pulses (⑦).

When the slope of rising sections of the second discharge pulse (⑧) is excessively steep, a difference between voltage levels detected in the respective pulses (⑥) may be large according to a time error (several nanoseconds) which is a standard of measurement. In this case, even when there is no approaching human body, a misrecognition that there is an approaching human body may occur.

To solve this problem, as shown in FIG. 9, voltages Va1<Vb1, Vc1, and Vd1 having different voltage levels are detected at different times in rising sections of the second discharge pulse (⑧) (a rising section of each pulse (⑥) temporally continuous to the first discharge pulse (⑦)). Then, it is possible to solve the problem that may occur when the slope of rising sections of the second discharge pulse (⑧) is steep.

Second, the number of effective pulses to be input to the charge amplifier 250 is different.

Conventionally, since the effective pulse is generated from a low voltage that is detected in a falling section of a discharge pulse less than 1 V, a large number of effective pulses are required to fully charge a charge amplifier. Consequently, a substantial amount of time is needed to charge the charge amplifier fully.

On the contrary, according to the present invention, the effective pulse is generated from a high voltage which is detected in a rising section of the discharge pulse, during which a voltage level of the effective pulse is changed to greater than or equal to 1 V, and thus it is possible to fully charge the charge amplifier 250 with relatively less number of effective pulses.

This means that less amount of time is needed to fully charge the charge amplifier 250 as compared to the related art. Therefore, the present invention is able to provide an apparatus for locking and unlocking a vehicle door which is capable of quickly detecting an approach of a human body at each cycle (e.g., four effective pulses) that is shorter than that of the related art.

According to the exemplary embodiments as described above, the apparatus for locking and unlocking a vehicle door which is robust to changes in an operating environment and is capable of quickly detecting an approach of a human body is provided. The apparatus adds up the pulse that is generated while the touch sensor is being discharged, with a delayed signal from an RC delay circuit, and then the apparatus determines whether or not a human body is approaching using an effective pulse detected in a rising section of the added pulse.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A door handle module for a vehicle, comprising:
   a pulse transformer configured to transform a first discharge pulse of a first voltage level, which is discharged from a touch sensor, to a second discharge pulse with a rising section in which the first discharge pulse increases to a second voltage level which is higher than the first voltage level;

an effective pulse generator configured to generate an effective pulse using a voltage detected in the rising section; and a charge amplifier configured to amplify the effective pulse to an analog voltage and to output the amplified analog voltage as a signal for controlling locking and unlocking of a vehicle door.

2. The door handle module of claim 1, wherein the pulse transformer is further configured to transform the first discharge pulse into the second discharge pulse by adding a delayed input pulse to the first discharge pulse, wherein the delayed input pulse is obtained by delaying an input pulse of the second voltage level, and wherein the impulse pulse of the second voltage level is input from an external source by a period of time.

3. The door handle module of claim 2, wherein the second discharge pulse comprises the first discharge pulse and the delayed input pulse, and the delayed input pulse is temporally continuous with the first discharge pulse.

4. The door handle module of claim 3, wherein the effective pulse generator is further configured to generate the effective pulse using a voltage detected in the rising section of the delayed input pulse.

5. The door handle module of claim 2, wherein the rising section of the second discharge pulse is a rising section of the delayed input pulse.

6. The door handle module of claim 2, further comprising:
a switch configured to generate a discharge path connecting the touch sensor and the effective pulse generator according to a switching operation,
wherein the pulse transformer is further configured to transform the first discharge pulse into the second discharge pulse by applying the delayed input pulse to the discharge path.

7. The door handle module of claim 6, wherein the pulse transformer comprises:
a resistor configured to receive the input pulse of the second voltage level input from the external source; and
a capacitor connected in parallel with the resistor and configured to generate the delayed input pulse by delaying the input pulse and applying the generated delayed input pulse to the discharge path.

8. The door handle module of claim 1, wherein the effective pulse generator comprises a NAND gate configured to perform a NAND operation on the second discharge pulse and an input pulse that is synchronized with the rising section of the second discharge pulse to generate the effective pulse.

9. The door handle module of claim 8, wherein the second discharge pulse comprises four pulses, and
the NAND gate is further configured to generate the effective pulse by performing a NAND operation on four voltages detected in respective rising sections of the four pulses having an identical voltage level and the input pulse.

10. The door handle module of claim 8, wherein the second discharge pulse comprises four pulses, and
the NAND gate is further configured to generate the effective pulse by performing a NAND operation on four voltages detected in respective rising sections of the four pulses and having different voltage levels and the input pulse.

11. An apparatus for locking and unlocking a vehicle door, the apparatus comprising:

a touch sensor embedded in a handle of the vehicle door and configured to discharge a charged capacitance according to an approach of a human body;
a door handle module configured to transform a first discharge pulse of a first voltage level that is generated according to the discharge of the touch sensor to a second discharge pulse with a rising section which increases the first discharge pulse to a second voltage level which is higher than the first voltage level, and to generate an effective pulse using a voltage detected in the rising section of the second discharge pulse transformed from the first discharge pulse; and
a controller configured to count the number of effective pulses and to determine, based on the counted number, whether the human body is approaching the touch sensor.

12. The apparatus of claim 11, wherein the door handle module is further configured to delay an input pulse input from the controller according to an RC time constant to generate a delayed input pulse with a rising section in which the input pulse increases to the second voltage level, and to generate the second discharge pulse from the first discharge pulse using the produced delayed input pulse.

13. The apparatus of claim 12, wherein the door handle module is further configured to generate the second discharge pulse that comprises the first discharge pulse and the delayed input pulse that is temporally continuous to the first discharge pulse.

14. The apparatus of claim 13, wherein the door handle module is further configured to generate the effective pulse using a voltage detected in the rising section of the delayed input pulse.

15. The apparatus of claim 11, wherein the door handle module comprises:
a pulse transformer configured to transform the first discharge pulse of the first voltage level, which is discharged from the touch sensor, into the second discharge pulse with the rising section in which the first discharge pulse increases to the second voltage level which is higher than the first voltage level; and
an effective pulse generator configured to generate the effective pulse using a voltage detected in the rising section of the second discharge pulse transformed from the first discharge pulse.

16. The apparatus of claim 15, wherein the pulse transformer is further configured to transform the first discharge pulse into the second discharge pulse by adding a delayed input pulse to the first discharge pulse, and the delayed input pulse is obtained by delaying an input pulse of the second voltage level input from the controller by a period of time.

17. The apparatus of claim 11, wherein the controller is further configured to control locking or unlocking of a vehicle door through wireless authentication with a smart key, in response to confirming the approach of the human body.

18. The apparatus of claim 11, wherein the door handle module is further configured to generate the effective pulse by performing a NAND operation on the second discharge pulse and an input pulse synchronized with the rising section of the second discharge pulse.

19. The apparatus of claim 18, wherein the second discharge pulse comprises four pulses, and
the door handle module is further configured to generate the effective pulse by performing a NAND operation on four voltages detected in respective rising sections of the four pulses having an identical voltage level and the input pulse.

20. The apparatus of claim 18, wherein the second discharge pulse comprises four pulses, and
the door handle module is further configured to generate the effective pulse by performing a NAND operation on four voltages detected in respective rising sections of the four pulses having different voltage levels and the input pulse.

* * * * *